US007786421B2

(12) United States Patent
Nikzad et al.

(10) Patent No.: US 7,786,421 B2
(45) Date of Patent: Aug. 31, 2010

(54) SOLID-STATE CURVED FOCAL PLANE ARRAYS

(75) Inventors: Shouleh Nikzad, Valencia, CA (US); Michael Hoenk, Valencia, CA (US); Todd Jones, Altadena, CA (US)

(73) Assignee: California Institute of Technology, Pasadena, CA (US)

(*) Notice: Subject to any disclaimer, the term of this patent is extended or adjusted under 35 U.S.C. 154(b) by 689 days.

(21) Appl. No.: 10/940,591

(22) Filed: Sep. 13, 2004

(65) Prior Publication Data

US 2005/0109918 A1 May 26, 2005

Related U.S. Application Data

(60) Provisional application No. 60/502,543, filed on Sep. 12, 2003.

(51) Int. Cl.
*H01L 27/00* (2006.01)
(52) U.S. Cl. ............. 250/208.1; 250/214.1; 250/214 R; 438/57
(58) Field of Classification Search .............. 250/208.1, 250/214.1, 214 R; 257/68; 438/57
See application file for complete search history.

(56) References Cited

U.S. PATENT DOCUMENTS

| 4,337,395 A * | 6/1982 | Alexander et al. ........... 250/332 |
| 4,467,361 A * | 8/1984 | Ohno et al. ................. 348/340 |
| 4,689,652 A * | 8/1987 | Shimada et al. ............. 257/443 |
| 5,376,810 A * | 12/1994 | Hoenk et al. ................ 257/228 |
| 6,791,072 B1 * | 9/2004 | Prabhu ..................... 250/208.1 |
| 2001/0019361 A1 * | 9/2001 | Savoye ....................... 348/222 |
| 2001/0020671 A1 * | 9/2001 | Ansorge et al. ............. 250/208.1 |
| 2001/0040639 A1 * | 11/2001 | Iwasaki ....................... 348/374 |
| 2002/0011639 A1 * | 1/2002 | Carlson et al. .............. 257/443 |

OTHER PUBLICATIONS

"Megapixel CCD thinning/backside progress at SAIC," A. R. Schaefer. R. H. Varian, J. Cover, and R. Larsen, Proc. of SPIE, 1447, 165 (1991).
"Organic polymer films for second order nonlinear applications," J.R. Hill, P. Pantelis, P.L. Dunn, and G.J. Davies, Proc. of SPIE, 1147, pp. 165-176 (1989).
"New organic and organometallic salts for second-order nonlinear optics," Seth R. Marder, et al., Proc. of SPIE, 1147, pp. 108-115 (1989).

(Continued)

*Primary Examiner*—Georgia Y Epps
*Assistant Examiner*—Kevin Wyatt
(74) *Attorney, Agent, or Firm*—Tope-McKay & Associates

(57) ABSTRACT

The present invention relates to curved focal plane arrays. More specifically, the present invention relates to a system and method for making solid-state curved focal plane arrays from standard and high-purity devices that may be matched to a given optical system. There are two ways to make a curved focal plane arrays starting with the fully fabricated device. One way, is to thin the device and conform it to a curvature. A second way, is to back-illuminate a thick device without making a thinned membrane. The thick device is a special class of devices; for example devices fabricated with high purity silicon. One surface of the device (the non VLSI fabricated surface, also referred to as the back surface) can be polished to form a curved surface.

1 Claim, 16 Drawing Sheets

OTHER PUBLICATIONS

"Modeling of diffusion bonding of metals." Z. X. Guo, N. Ridley, Materials Science and Technology, 3, 945 (1987).

"Back illuminated 2048 × 2048 charge couple device performance," K. Gladhill, M. Blouke, P. Marriott, T. Houk, B. Corrie, and H. Marsh, Proc. of SPIE, 1656, (1992).

"Growth of a delta-doped silicon layer by molecular beam epitaxy on a charge-coupled device for reflection-limited ultraviolet quantum efficiency," M.E. Hoenk, P.J. Grunthaner, F.J. Grunthaner, M. Fattahi, H.-F, Tseng and R.W. Terhune, Appl. Phys. Lett., 61, 1084 (1992).

"Epitaxial growth of p+ silicon on a backside-thinned CCD for enhanced UV response," M.E. Hoenk, P.J. Grunthaner, F.J. Grunthaner, R.W. Terhune, and M. Fattahi, Proc. of SPIE, 1656, 488 (1992).

"Recent Developments in Large Area Scientific Grade CCD Image Sensors," Janesick. J., Elliot, T., Bredthauer, R., Cover, J. Schaefer, R., and Varian, R., Proc. of SPIE, 1071, (1989).

"A compact, inexpensive apparatus for one-sided etching in KOH and HF," Joseph T. Kung, Andrew N. Karanicolas, and Hae-Seung Lee, Sensors and Actuators A, 29, 209 (1991).

"Bulk Micromachining of Silicon," Gregory T. A. Kovacs, Nadim I. Maluf, and Kurt E. Petersen, Proc. of the IEEE, 86, No. 8, (1998).

"Bump Bonded Illuminated CCDs," M. P. Lesser, Ann Bauer, and Lee Ulrickson, Proc. of SPIE, 1656, 508 (1992).

"Enhancing Back-illumuniated Performance of Astronomical CCDs," M. P. Lesser and V. Iyer, Proc. of SPIE, 3355, 446 (1998).

"Delta-doped CCDs: High QE With Longterm Stability at UV and Visible Wavelengths," S. Nikzad, M.E. Hoenk, P.J. Grunthaner, R.W. Terhune, F.J. Grunthaner, R. Wizenread, M. Fattahi, and H-F. Tseng, Proc. of SPIE, 2198, 907 (1994).

"Delta-doped CCDs As Stable, High Sensitivity, High Resolution UV Imaging Arrays," S. Nikzad, M.E. Hoenk, P.J. Grunthaner, R.W. Terhune, R. Wizenread, M. Fattahi, H-F, Tseng, and F.J. Grunthaner, Proc. of SPIE, 2217, 355 (1994).

"High sensitivity Charged-Coupled Device (CCD) imagers for television," Eugene D. Savoye, Donald F. Battson, Thomas W. Edwards, William N. Henery, Donald R. Tshudy, and L. Franklin Wallace, Proc. of SPIE, 501, 32 (1984).

"Improved Uniformity in Thinned Scientific CCDs," Rusty Winzenread, Pat Chiao, Weng-Lyang Wang. and Lloyd Robinson, Proc. of SPIE. 1161.

"Flat, Thinned Scientific CCDS," Rusty Winzenread, Proc. of SPIE, 2198, 886 (1994).

* cited by examiner

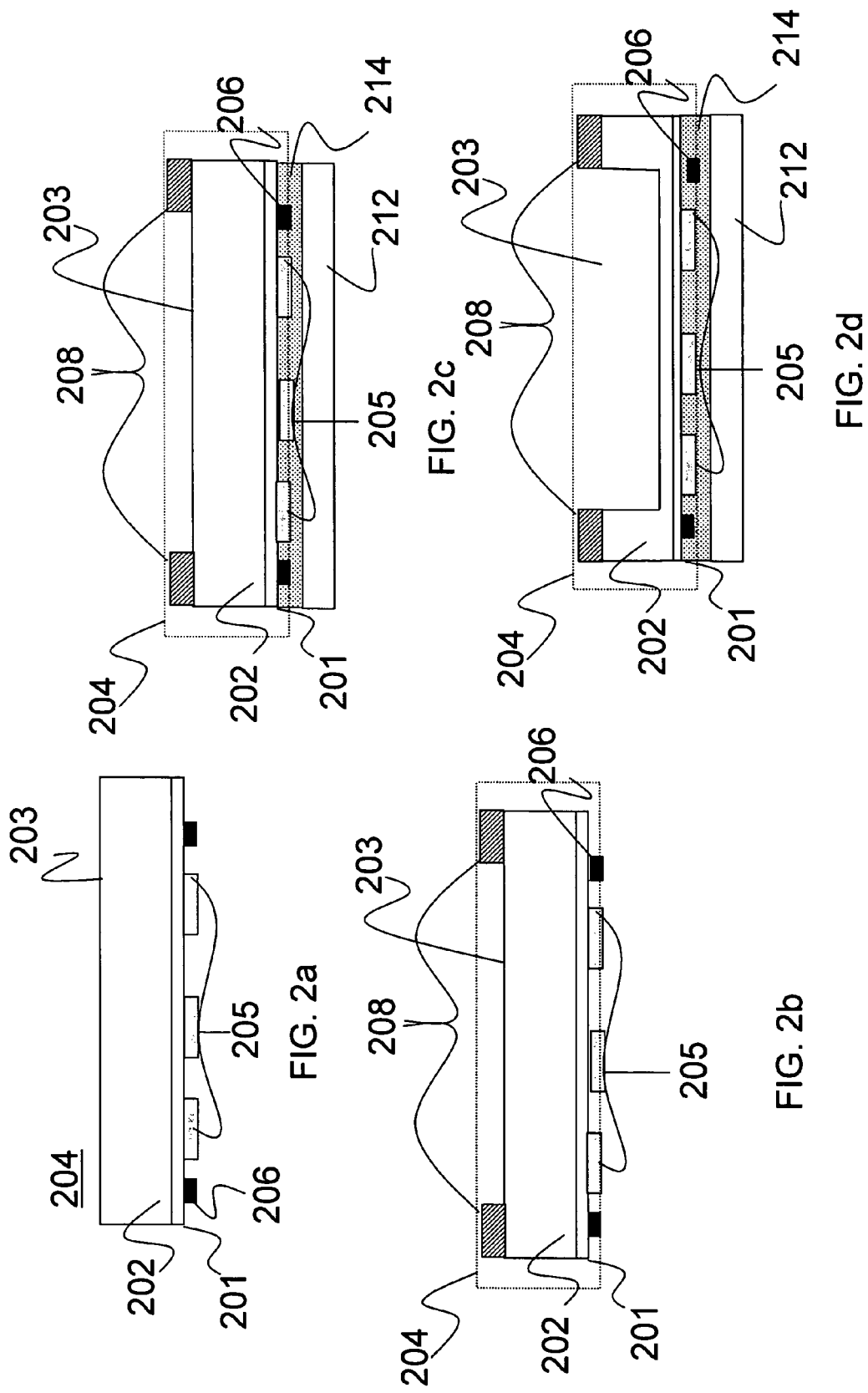

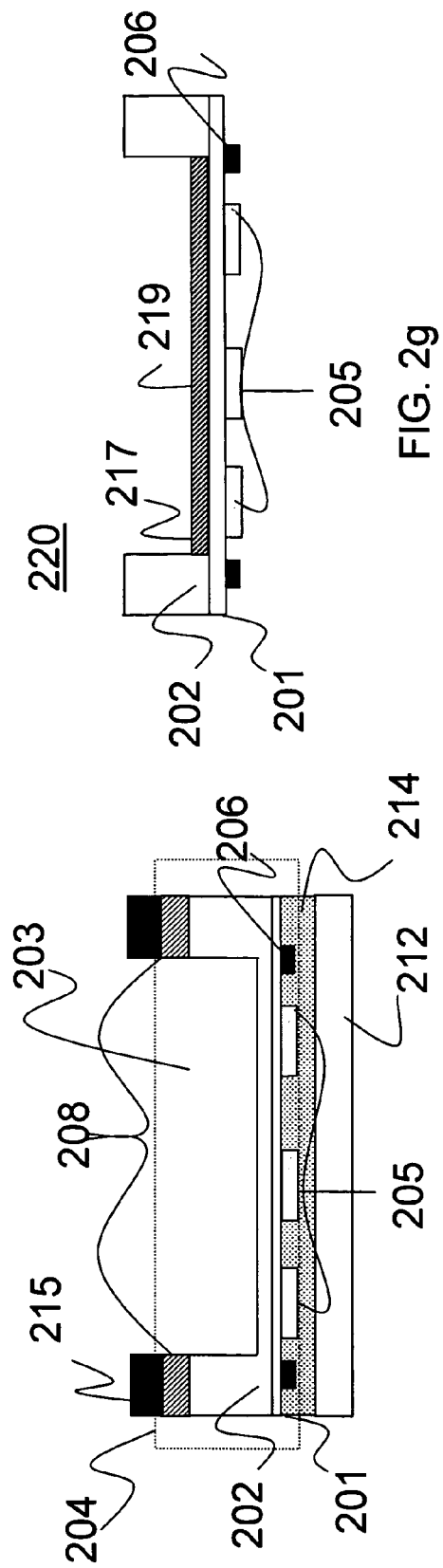
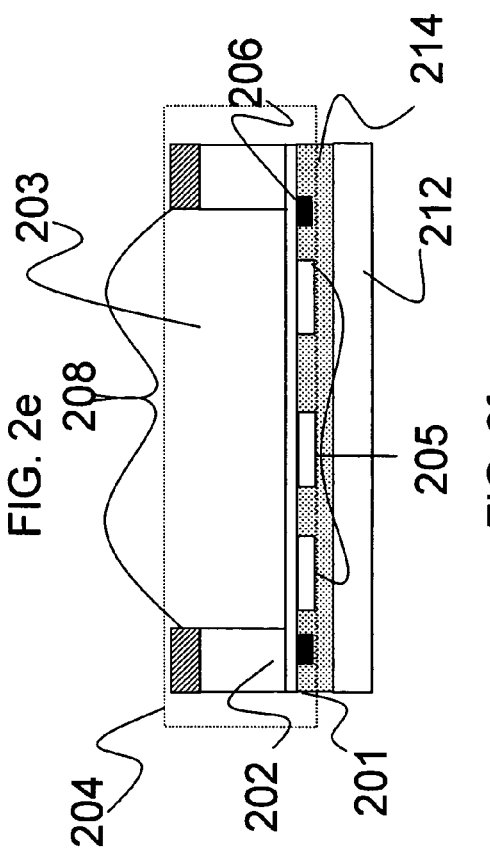
FIG. 2e
FIG. 2f
FIG. 2g

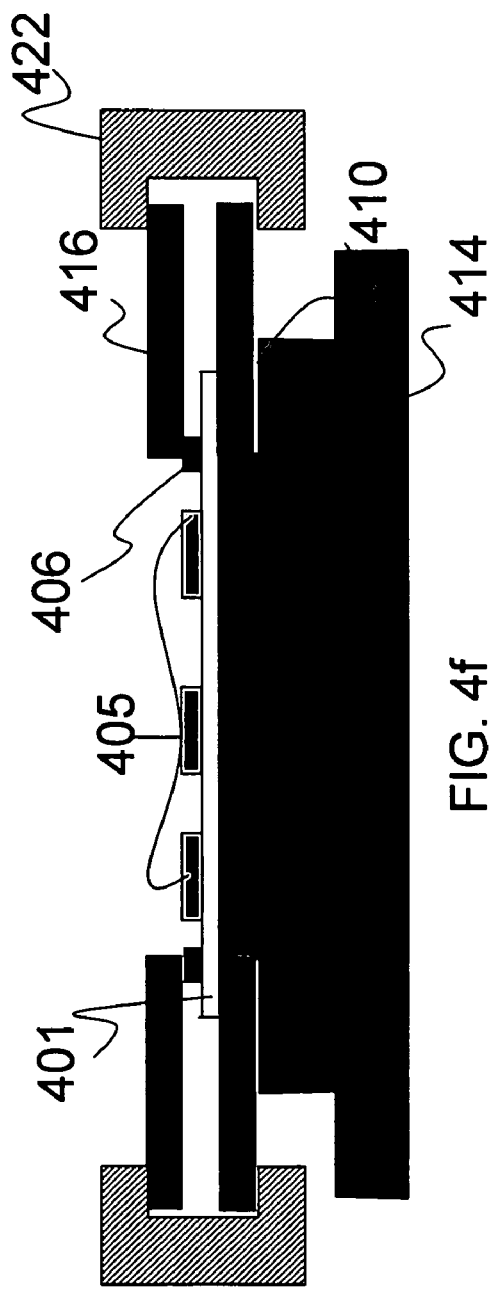
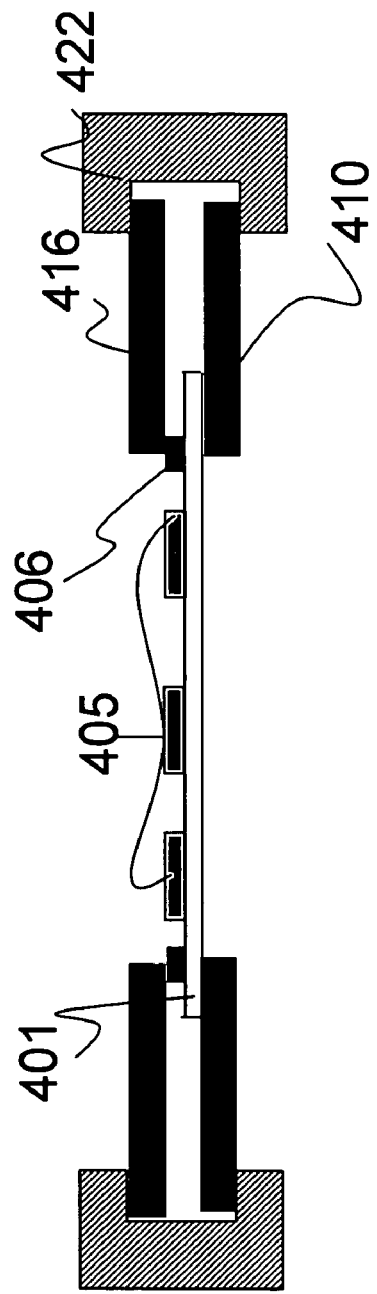

SOLID-STATE CURVED FOCAL PLANE ARRAYS

PRIORITY CLAIM

The present application claims the benefit of priority of U.S. Provisional Patent Application No. 60/502,543, filed Sep. 12, 2003, entitled "Curved Focal Plane Arrays Using Polished Back-illuminated High Resistivity Detectors."

STATEMENT OF GOVERNMENT INTEREST

This invention described herein was made in the performance of work under a NASA contract, and is subject to the provisions of Public Law 96-517 (35 USC 202) in which the Contractor has elected to retain title.

BACKGROUND OF THE INVENTION (1) Technical Field

The present invention relates to solid-state curved focal plane arrays. More specifically, the present invention relates to a system and method for making solid-state curved focal plane detector arrays that may be matched to a given optical system.

(2) Background

Conventional detector arrays are flat; therefore, a matching flat optical focal surface is required in designing optical systems. To meet this requirement, a high price is often paid in terms of size, weight, complexity, cost, and performance. The human eye provides a natural example of an imaging system whose detector (the retina at the back of the eye) is curved to correspond with its focal surface (the lens). The Schmidt camera (an ultra-fast telescope with a film plate holder instead of an eyepiece at its focus) is a classic example of a system which will benefit from a curved focal plane array (CFPA). Other examples of systems which could benefit from curved focal plane arrays include: wide-field rover cameras, star-tracker cameras, and far ultra-violet (UV) instruments.

Curved focal plane detector arrays simplify optical designs by reducing the number of optical elements by up to a factor of four, increasing reliability of the system, and increasing the margins of tolerance in optical design. Therefore, the production of lighter and more efficient optical systems for airborne or space-borne missions is possible. In addition, there are commercial applications in the areas of charged-particle detection systems and miniaturized cameras.

Curved focal plane detector arrays offer other advantages. While other aberrations depend on the stop and conjugate positions within an optical system, field curvature generally depends only on the basic constructional parameters of the system and the throughput. Thus, field curvature is very difficult to change, and can be regarded as intrinsic to an optical system. The designer has more degrees of freedom in controlling other aberrations than in controlling field curvature. Curved focal plane detector arrays offer a way out of this dilemma by permitting the designer to concentrate on the correction of other aberrations rather than having to abandon a certain design approach due to excessive field curvature. By such innovation, for example, an instrument having the capabilities of National Aeronautics and Space Administration's (NASA's) Multi-angle Imaging SpectroRadiometer (MISR) could be miniaturized from the size of an office desk to the size of a suitcase. One method of improving optical systems is using fiber-optic faceplates for matching a curved focal surface to a flat detector. Inherent limitations of this approach include: mismatch of fiber-optic faceplate and detector resolution; limited transmission wavelengths of fiber (e.g., opaqueness at UV wavelengths); and alignment complexities.

Many NASA missions rely on imaging and spectroscopy instruments. The NASA vision of smaller, lower cost, and more frequent missions mandates the miniaturization of instruments. For optical systems, the designer generally must introduce one or several additional optical elements to flatten the inherently curved focal surface. This complication and its corresponding penalty in mass, performance, and cost can be avoided if the detector itself is made to conform to the naturally-curved focal surface of a much simpler optical design.

In practice, micro-channel plates (MCPs) have been made in curved configurations, making the NASA's Far Ultraviolet Spectroscopic Explorer (FUSE) and the Alice instrument in the European Space Agency's Rosetta mission possible. However, in addition to the difficulties and cost associated with fabrication of these especially-curved MCPs, these instruments come with the higher mass and power overhead of MCPs.

Both the FUSE and Rosetta missions benefit from curved detector technology. These missions are designed to perform detailed UV spectroscopy by collecting photons diffracted from curved gratings with detectors of matched curvature. For these missions MCPs with the needed curvature were provided. In FUSE, the MCP detectors are curved and positioned to match the Rowland circle of the gratings. The Alice instrument (an ultraviolet imaging spectrometer) in the Rosetta mission is similar in concept and smaller in size. The very light-weight Alice instrument, approximately 2.2 kilograms (kg), credits its reduced mass and cost to the innovations of this mechanical design, wherein the input surface of its MCP has been made curved to match the 150 millimeter (mm) diameter Rowland circle for optimum focus.

Development of simple and low-cost technologies for fabricating curved solid-state detector arrays, whose curvature can be matched to the requirements of a specific system enables significant advances. Re-tooling the very-large-scale-integration (VLSI) industry from today's flat planar substrates to new production in curved space is a major challenge. Fabrication of CFPAs on individually curved substrates using e-beam lithography followed by processing, while an effective option, is very costly.

One example of a flat focal plane arrays is a charge-coupled device (CCD). CCDs are the detectors of choice for many NASA applications because back-illuminated CCDs potentially have the highest quantum efficiency in the ultraviolet and visible parts of the spectrum. However, CCDs require removal of the silicon substrate, i.e., thinning, and a surface treatment of the backside of the CCD to allow detection of UV photons.

Back-illuminated standard CCDs must be thinned to a thickness of approximately 10 to 20 µm corresponding to the epitaxially grown silicon layer (referred to as the epilayer), a property of the original CCD design. A natural consequence of having such a thin structure laced with electronic circuitry is that it will wrinkle with a height variation of 30 to 50 micrometers (µm). This is undesirable for astronomy applications which require focal plane flatness within fractions of a micron. Furthermore, such a membrane is fragile and prone to fracture when subjected to repeated flexing, which is inevitable in the temperature cycling of operational instruments. To obtain a thinned, flat, focal plane array, a rigid support can be attached to the CCD prior to the thinning process or after the thinning process. Attachment of a support substrate to the CCD front-side prior to thinning has been implemented by a number of groups, e.g., "Bump Bonded Back Illuminated CCDs" by M. P. Lesser, Ann Bauer, Lee Ulrickson, Proceedings of SPIE, vol. 1695, p. 508 (1992) and "Flat, Thinned Scientific CCDs" by Rusty Winzenread, Proceedings of SPIE, vol. 2198, p. 886 (1994) and "Thinned Charge Coupled Devices with Flat Focal Planes for UV Imaging," by Todd J. Jones, Peter W. Deelman, S. Tom Elliott, P. J. Grunthaner, R. Wilson, and Shouleh Nikzad, Proceedings of the SPIE, vol. 3965, p. 148 (2000).

A number of UV-enhancement treatments have been demonstrated for back-illuminated CCDs: see for example, "Recent Developments in Large Area Scientific Grade CCD Image Sensors," J. Janesick, T. Elliot, R. Bredthauer, J. Cover, R. Schafer and R. Varian, Proceedings of SPIE, vol. 1071 (1989), "Growth of a Delta-doped Silicon Layer by Molecular Beam Epitaxy on a Charge-coupled Device for Reflection-limited Ultraviolet Quantum Efficiency," M. E. Hoenk, P. J. Grunthaner, F. J. Grunthaner, M. Fattahi, H. F. Tseng, and R. W. Terhune, Applied Physics Letters vol. 61, p. 1084 (1992), and "Enhancing Back-Illuminated Performance of Astronomical CCDs," M. P. Lesser and V. Iyer, Proceedings of SPIE, vol. 3355, p. 446 (1998).

Delta-doping processes have also been developed to address UV enhancement CCDs as described in the above referenced paper, "Growth of a Delta-doped Silicon Layer by Molecular Beam Epitaxy on a Charge-coupled Device for Reflection-limited Ultraviolet Quantum Efficiency," M. E. Hoenk, P. J. Grunthaner, F. J. Grunthaner, M. Fattahi, H. F. Tseng, and R. W. Terhune, Applied Physics Letters vol. 61, p. 1084 (1992). Delta-doped CCDs exhibit uniform and stable 100% internal quantum efficiency in the visible and ultraviolet regions of the spectrum without hysteresis, see "Delta-Doped CCDs as Stable, High Sensitivity, High Resolution UV Imaging Arrays," S. Nikzad, M. E. Hoenk, P. J. Grunthaner, R. W. Terhune, R. Wizenread, M. Fattahi, H-F. Tseng and F. J. Grunthaner, Proceedings of SPIE, vol. 2217, p. 355 (1994).

A number of thinning approaches have been developed over the years at different companies and institutions. A summary and historical account of these approaches can be found in "Flat, Thinned Scientific CCDs," Rusty Winzenread, Proceedings of SPIE, vol. 2198, 886 (1994). The early thinning efforts resulted in free-standing membranes, see "Improved Uniformity in Thinned Scientific CCDs," Rusty Winzenread, Pat Chaio, Weng-Lyang Wang, and Lloyd Robinson, Proceedings of SPIE, vol. 1161, (1989). Several groups were able to produce thinned membranes supported on rigid substrates, e.g, Radio Corporation of America (RCA) as described in "High Sensitivity Charged-Coupled Device (CCD) Imagers for Television," Eugene D. Savoye, Donald F. Battson, Thomas W. Edwards, William N. Henry, Donald R. Tshudy, and L. Franklin Wallace, Proceedings of SPIE, vol. 501, p. 32 (1984), University of Arizona as described in "Bump Bonded Back Illuminated CCDs," M. P. Lesser, Ann Bauer, and Lee Ulrickson, Proceedings of SPIE, vol. 1656, p. 508 (1992) Tektronics as described in "Back Illuminated 2048x2048 Charge-coupled Device Performance," K. Gladhill, M. Blouke, P. Marriott, T. Houk, B. Corrie, and H. Marsh, Proceedings of SPIE, vol. 1656 (1992), EG&G Reticon as described in "Flat, Thinned Scientific CCDs," Rusty Winzenreqad, Proceedings of SPIE, vol. 2198, p. 886 (1994) and Science Applications International Corporation (SAIC) as described in "Megapixel CCD Thinning/Backside progress at SAIC," A. R. Schaefer, R. H. Varian, J. Cover, and R. Larsen, Proceedings of SPIE, vol. 1147, p. 165 (1991).

What is needed is a system and method for producing curved focal plane detector arrays that may be matched to a given optical system.

SUMMARY OF THE INVENTION

The present invention provides a system and a method that overcomes the aforementioned limitations and fills the aforementioned needs by providing a solid-state curved focal plane array that may be matched to a given optical system.

In one aspect of the invention, is method for making a detector array comprising acts of: shaping a flat solid-state focal plane detector array into a curved solid-state focal plane detector array.

In another aspect, the act of shaping includes acts of: thinning the flat solid-state focal plane detector array into a thin deformable membrane; and creating a finite radius of curvature in the thin deformable membrane.

In yet another aspect, the act of creating a radius is selected from the group consisting of applying air pressure to a portion the thin membrane, applying a vacuum to a portion of the thin membrane and applying a piezo-electric transducer force to the thin deformable membrane.

In another aspect, the method further comprises an act of passivating the thin deformable membrane.

In another aspect, the act of shaping includes an act of polishing the flat solid-state focal plane detector array to form a curved surface.

In yet another aspect, is a method for manufacturing a detector array comprising acts of: acquiring a flat solid-state focal plane detector array having detector circuitry on a first side; removing a portion of the flat solid-state focal plane detector array resulting in a thin deformable membrane having a detector circuitry side and a second side; passivating the second side of the thin membrane; and conforming the thin membrane to have a finite radius of curvature.

In yet another aspect, the act of conforming includes acts of: supporting a portion of the thin membrane by membrane supports; and applying air pressure to a non-supported portion of the thin membrane such that the air pressure results in the conforming the thin membrane to have a finite radius of curvature.

In yet another aspect, the act of conforming includes acts of: coating a curved substrate with a bonding material; and pushing the thin membrane onto the curved substrate.

In yet another aspect, the act of pushing further comprises an act of providing air pressure in order to push the thin membrane onto the curved substrate.

Another aspect, further comprises acts of placing a balloon membrane over the thin membrane; and applying the air pressure to the balloon membrane, such that the balloon membrane applies pressure to the thin membrane pushing the thin membrane onto the curved substrate.

In another aspect, the act of pushing further comprises an act of providing piezo-electric induced pressure.

In another aspect, the act of conforming includes acts of: coating a curved substrate with a bonding material; and pulling the thin membrane onto the curved substrate via vacuum pressure.

In another aspect, the act of conforming includes acts of: bonding the thin membrane to a piezo-electric transducer wafer; and actuating the piezo-electric transducer wafer, conforming the thin membrane to a finite radius of curvature.

In another aspect, the act of conforming includes acts of: bonding the thin membrane to one side of a small volume; and npressurizing the small volume, such that the thin membrane is conformed to a finite radius of curvature.

In another aspect, is a method for creating a curved focal plane detector array comprising acts of: polishing one side of a high-purity device to a finite radius of curvature; and adding a highly-doped electrode to the polished side of the high-purity device.

Yet another aspect is a detector array comprising: a detector device having a first side and a second side, wherein in the first side is a curved surface; detector circuitry attached with the second side of the device; and a passivation layer formed on at least a portion of the first side.

BRIEF DESCRIPTION OF THE DRAWINGS

The objects, features and advantages of the present invention will be apparent from the following detailed descriptions of the preferred aspect of the invention in conjunction with reference to the following drawings, where:

FIGS. 2a-g form an act-by-act illustration of a cross-sectional view of a CFPA in various stages of production according to a method of the present invention;

FIGS. 4a-4g form an act-by-act illustration of a cross-sectional view of a device depicting the acts involved in full-frame thinning;

DETAILED DESCRIPTION

Figure 1:
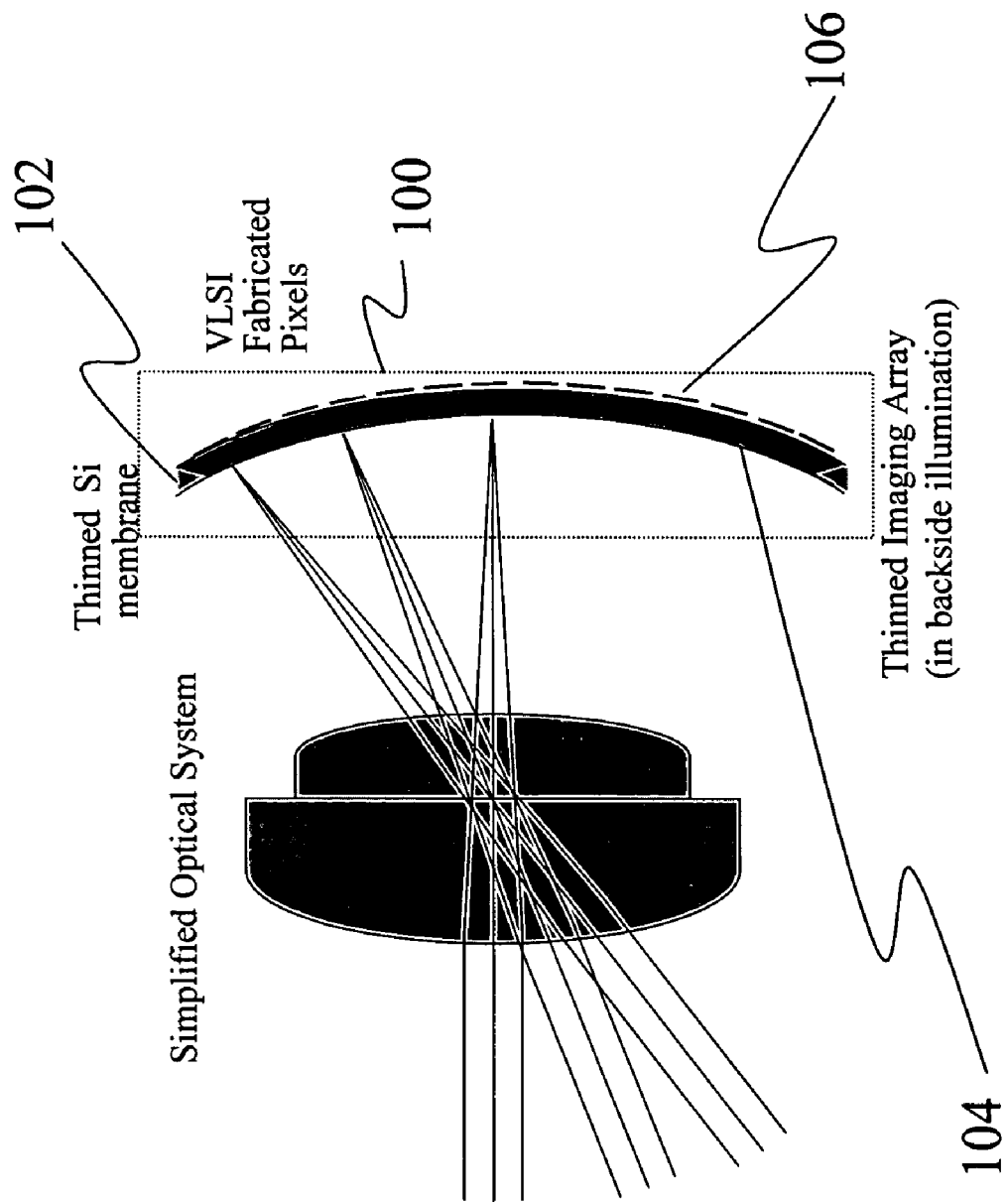
FIG. 1 is a schematic illustration depicting a curved focal plane array (CFPA) according to the present invention.

The present invention relates to solid-state curved focal plane detector arrays. More specifically, the present invention relates to a system and method for making solid-state curved focal plane detector arrays that may be matched to a given optical system for spatially resolved detection of light (visible and UV as well as infrared) and low energy particles. The following description, taken in conjunction with the referenced drawings, is presented to enable one of ordinary skill in the art to make and use the invention and to incorporate it in the context of particular applications. Various modifications, as well as a variety of uses in different applications, will be readily apparent to those skilled in the art, and the general principles, defined herein, may be applied to a wide range of embodiments. Thus, the present invention is not intended to be limited to the embodiments presented, but is to be accorded the widest scope consistent with the principles and novel features disclosed herein. Furthermore, it should be noted that unless explicitly stated otherwise, the figures included herein are illustrated diagrammatically and without any specific scale, as they are provided as qualitative illustrations of the concept of the present invention.

(1) Introduction

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the claims herein is not intended to invoke the provisions of 35 U.S.C. 112, Paragraph 6.

The description outlined below sets forth solid-state curved focal plane detector arrays. More specifically, the description sets forth a system and method for making solid-state curved focal plane detector arrays having their design matched to the specific natural focal plane for any general optical system. These solid-state curved focal plane detector arrays are applicable to CCDs, CMOS arrays, and other detector and imaging arrays.

One benefit of the low-coast approach described below is the de-coupling of the curvature from the VLSI fabrication of imaging devices or detector arrays. As will be described in further detail below, there are two embodiments for making a curved focal plane array starting with the fully fabricated device. In one embodiment, the device is thinned and it can be conformed to curvature. In a second embodiment, the device is thick but can be back-illuminated without making a thinned membrane. In the second embodiment, the thick device is a special class of devices; for example devices fabricated with high purity silicon. One surface of the device (the non VLSI fabricated surface, also referred to as the back surface) can be polished to form a curved surface.

Figure 11:
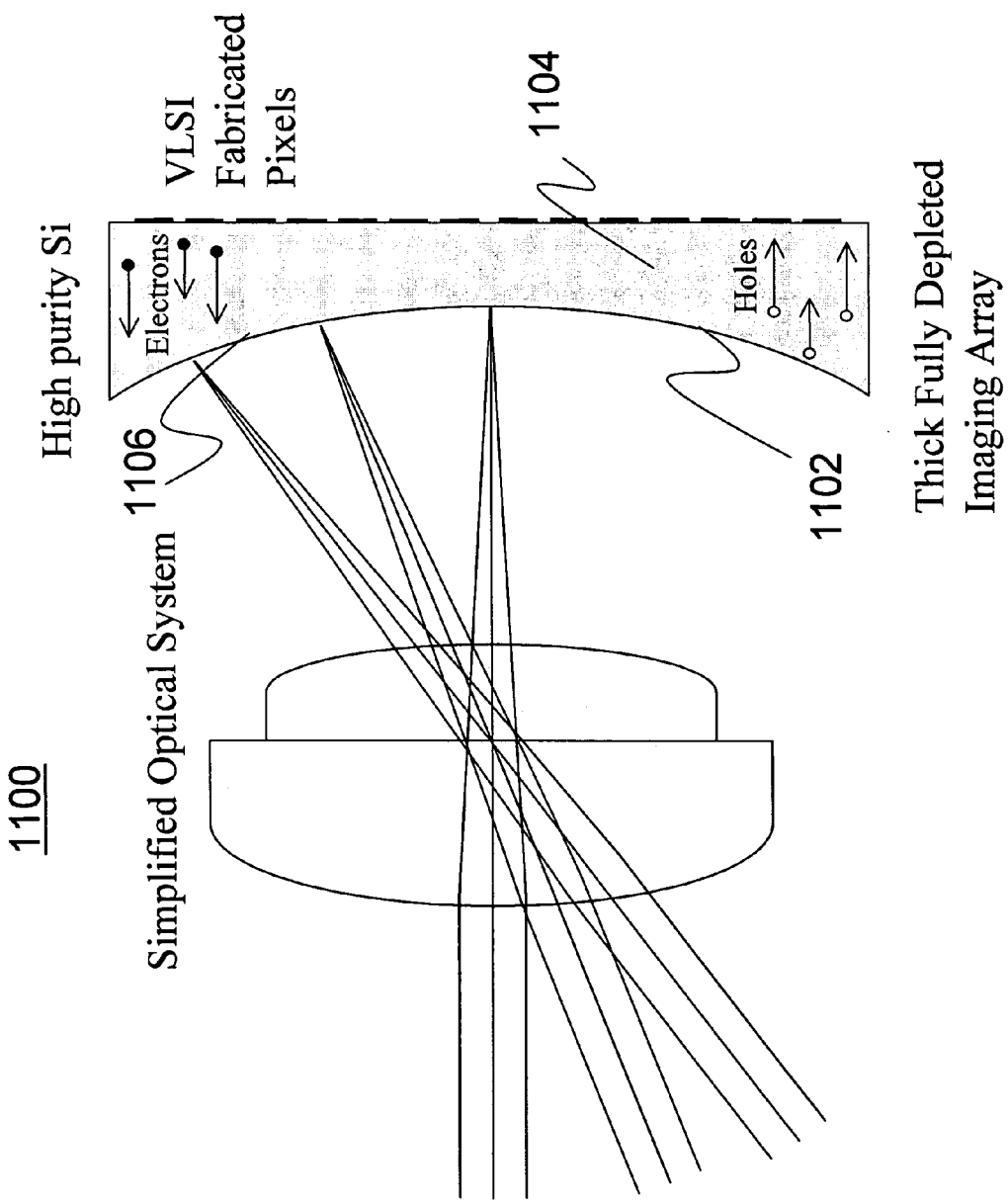
FIG. 11 depicts a thick high-purity device which is back-illuminated and the imaging back surface is curved.

Two embodiments of a CFPA where the VLSI device fabrication is decoupled from the required curvature schematically shown in FIGS. 1 and 11. In FIG. 1, the device is thinned to a deformable membrane and can be curved to various curvatures. This device can be back-illuminated or front-illuminated, noting that FIG. 1 depicts the device being back-illuminated. In FIG. 11, the device is thick and back-illuminated and the imaging back surface is curved. Full depletion of the high-purity device ensures that photo-generated carriers are driven by an electric field to the front pixels. Optical rays shown are for illustration only.

A. Definitions

In order to provide a working frame of reference, first a glossary of some of the terms used in the description and claims is given as a central resource for the reader. The glossary is intended to provide the reader with a general understanding of various terms as they are used in this disclosure, and is not intended to limit the scope of these terms. Rather, the scope of the terms is intended to be construed with reference to this disclosure as a whole and with respect to the claims below.

Before describing the specific details of the present invention, it is useful to provide a centralized location for various terms used herein and in the claims. A definition has been included for these various terms. However, the definition provided should not be considered limiting to the extent that the terms are known in the art. These definitions are provided to assist in the understanding of the present invention.

Curved—The term "curved" refers to a device having a finite radius of curvature; i.e., less than infinity.

Solid-State—The term "solid-state" refers to semiconductor devices.

Standard—The term "standard" refers to the most commonly used form of the solid-state detector arrays. In the context of CCD architecture, it is defined as a device comprised of a highly-doped substrate and a lightly-doped high quality epitaxial layer (epilayer). This designation of standard is to be distinguished from the special class of detector arrays that are fabricated in high-purity material such as high purity silicon CCDs.

(2) Details

A. Overview of the Membrane Curved Focal Plane Detector Array

FIG. 1 depicts one embodiment of a curved focal plane detector array 100 comprising a thin membrane 102 having a first side 104 and a second side 106. The curved focal plane detector array 100 is illuminated on the first side 104 and has detector circuitry on the second side 106. In one embodiment, the detector circuitry comprises a set of very large scale integration fabricated pixels. This type of a detector is often referred to as a back-illuminated detector. One skilled in the art will appreciate that the curved focal plane detector array 100 may also be illuminated on the second side 106, which is referred to as a front-illuminated detector. Further, one skilled in the art will appreciate that while the curvature of the thinned membrane 102 is concave, that the thinned membrane 102 can be formed into either a concave or convex shape which may also be front or back-illuminated. The thinned membrane could also be thinned in one or two dimensions, either cylindrically or spherically curved.

One method of manufacturing the curved focal plane detector array 100 is to thin a standard device (e.g., a fully processed CCD) starting from the surface of the standard device that does not have detector circuitry down to 10-20 microns creating a deformable membrane. The surface of the deformable membrane is then passivated. Next, the deformable membrane may be conformed into a curved shape either by attaching the deformable membrane to a rigid, curved substrate or by applying a force through air pressure, a balloon, vacuum, or piezoelectric tranducer (PZT) to conform a freestanding membrane to curvature. The unique features of this approach are three-fold: first, it is applicable to back-illuminated as well as front-illuminated devices; second, it is compatible with techniques for adjusting the curvature such as PZT (useful for adaptive optics); and third, it can be extended to other detector materials systems and spectral ranges such as gallium nitride and alloys (solar blind UV) or infrared (IR) arrays, respectively. This technique also lends itself to the edge-buttable style to mosaic large format arrays for wide-angle instruments.

The radius of curvature required will cause some stress in the curved focal plane detector array 100. The strain induced in a small square membrane forced to conform to a spherical curve of a given radius of curvature is the cosine of the ratio of the square's side to the radius minus one, as shown in the following equation:

$$s = \cos\left(\frac{l}{r}\right) - 1$$

where s is the strain, l is the length of the square's side, r is the radius and the ratio of l/r is much less than 1. For example, for a thin, 1 cm² array deformed to produce a 15.8 cm radius of curvature (ROC), a 0.2% strain will be induced. Initial studies and calculations have shown that the induced low stress has negligible effects on the device either mechanically or electronically.

B. The Process for Making the Membrane Curved Focal Plane Detector Array

1. Frame Thinning the Standard Device

FIGS. 2a-2g depict various acts that are performed in order to thin a standard device 204 into the curved focal plane detector array 100, shown in FIG. 1, in accordance with one embodiment of the device taught herein. One skilled in the art will appreciate that certain details well-known in the art are not described for clarity. The acts described herein are applicable to devices in die and wafer format supported or free standing. Further, these acts are generally independent of the device fabrication process and are also applicable to edge-buttable detector arrays, for mosaic fabrication of large arrays.

In one embodiment as shown in FIG. 2a, the curved focal plane detector array 100, shown in FIG. 1, is fabricated from a standard device 204. In one embodiment, the standard device 204 comprises a p+ doped substrate 202 having an epitaxial layer 201 on one side. The standard device 204 further comprises detector circuitry 205 and bondpads 206 located on the epitaxial layer opposite the p+ doped substrate 202.

As shown in FIG. 2b, the first act in creating curved focal plane detector 100 is providing a silicon nitride layer 208. The silicon nitride layer 208 will be discussed in further detail below.

The next act, as shown in FIG. 2c, is employing a bond 210 for attachment of support substrate 212 to one side 214 of the standard device 204 prior to thinning. One skilled in the art will appreciate that there are several different types of bonds that may be used in attaching the support substrate 212 to the standard device 204. For example, a temporary wax bond may be used. The type of bond used will depend partly on the type of processing that the device will receive during the remainder of the manufacturing cycle. The support substrate 212 is designed to cover the entire standard device.

The next act is thinning. One embodiment utilizes a frame thinning process. The term "frame thinning" refers to leaving a thick frame around the thin membrane.

In the frame thinning embodiment, a thick frame remains beneath the bondpads 206. As shown in FIG. 2b, the region to be thinned is sharply defined on the one side 203 of the standard device 204 by the application of a protective silicon nitride layer 208. In one embodiment, the silicon nitride layer 208 may be applied using Plasma Enhanced Chemical Vapor Deposition (PECVD). The silicon nitride layer 208 blocks the etching action of a bulk material etchant, such as potassium hydroxide (KOH). Shadow masking may be used to define the frame for the silicon nitride layer deposition which determines the area to be etched. An alignment device may be used to place the masks and hold the standard device 204 during the silicon nitride layer deposition. For more information regarding frame thinning the reader is directed to "Flat, Thinned Scientific CCDs," Rusty Wizenread, Proceedings of SPIE, vol. 2198, p. 886 (1994).

An act of chemical thinning begins after the standard device 202 is bonded to the support substrate 212, and the region to be thinned has been defined by the silicon nitride layer 208 previously described. The act of chemical thinning includes an act of etching away a portion of the standard device 204. In one embodiment, the p+ doped substrate 202 is removed in the thinned regions; thus the thinned regions are only 10 to 20 microns thick and comprise the epitaxial layer 201. One skilled in the art will appreciate that there are many ways to etch a standard device 204. Further details regarding one embodiment of the etching process, as shown in FIGS. 2d-2f will be discussed below.

FIG. 2g depicts the thinned standard device 204 after the act of chemical thinning has been performed.

Figure 3:
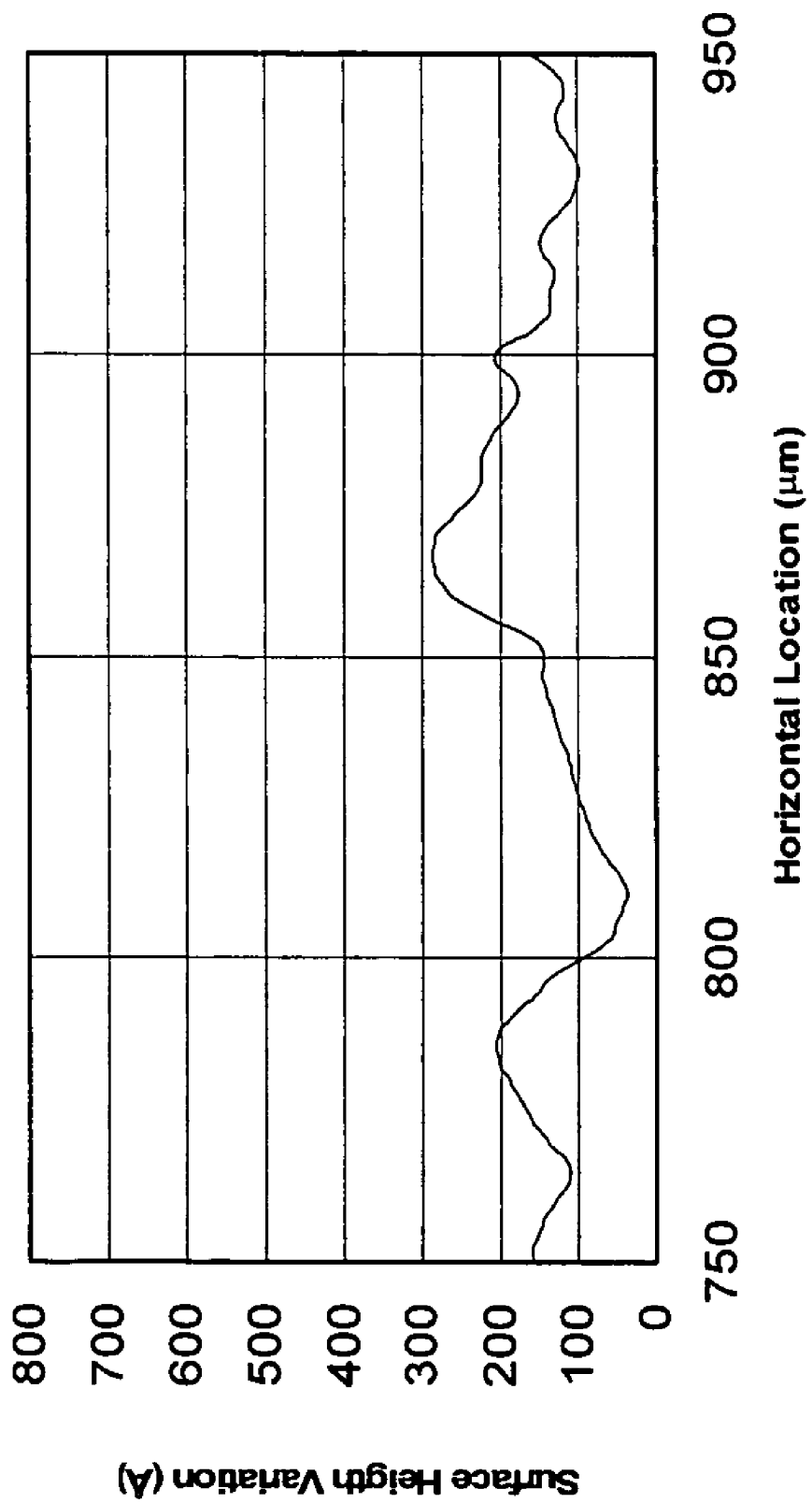
FIG. 3 is a graph depicting an example 200 micrometer segment of a standard detector, depicting a quantification of the optical flatness of the surface as obtained by surface profilometry.

Surface profilometry was used to quantify the optical flatness of the surface of the standard detector 204. FIG. 3 shows a 200 micrometer segment, from 750 micrometers to 950 micrometers of a linescan, which is typical a typical representation of the entire etched surface. The linescan is plotted showing surface height variation in angstroms. The data shows an approximate 200 angstrom peak-to-peak variation in the height of the etch surface. This degree of flatness is suitable for the demanding requirements of optics in astronomical instruments.

2. Full-Frame Thinning

In another embodiment, the device is thinned utilizing a full-frame thinning process. FIGS. 4a-4g depict the acts involved in full-frame thinning.

Figure 4A:
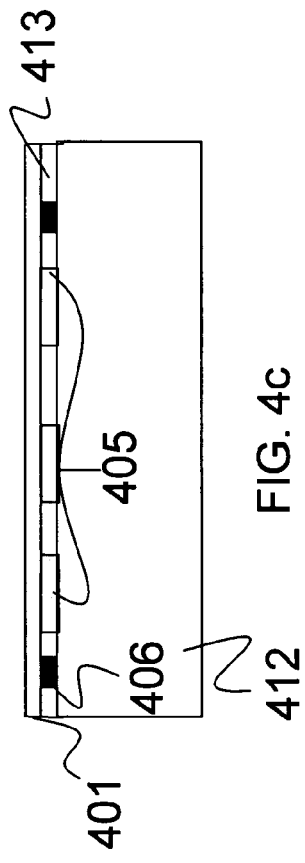

FIG. 4a depicts a standard device 404 having a substrate layer 402 connected with an epilayer 401. The epilayer 401 supports detector circuitry 405 and bondpads 406.

Figure 4B:
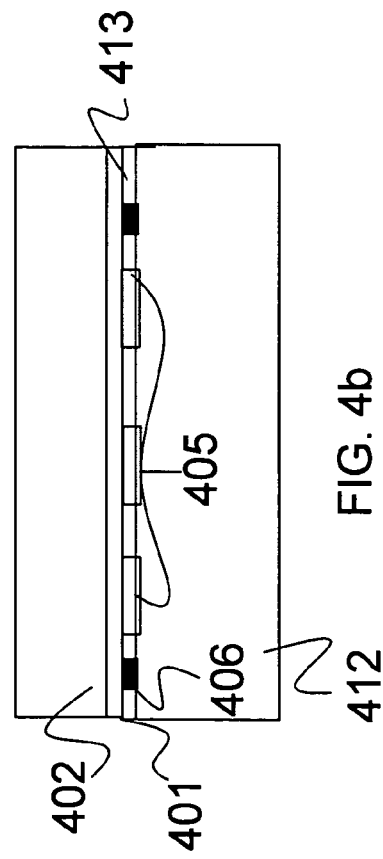

As shown in FIG. 4b, an act of bonding a support substrate 412 with the standard device 404 is performed. In one embodiment the bond 413 is a wax bond.

Figure 4C:
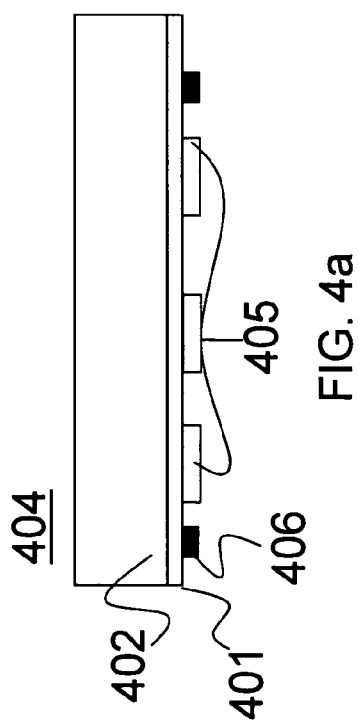

Next, as shown in FIG. 4c, an act of removing the substrate layer 402 is preformed. The substrate layer 402 is etched away, leaving the epilayer 401.

Figure 4D:
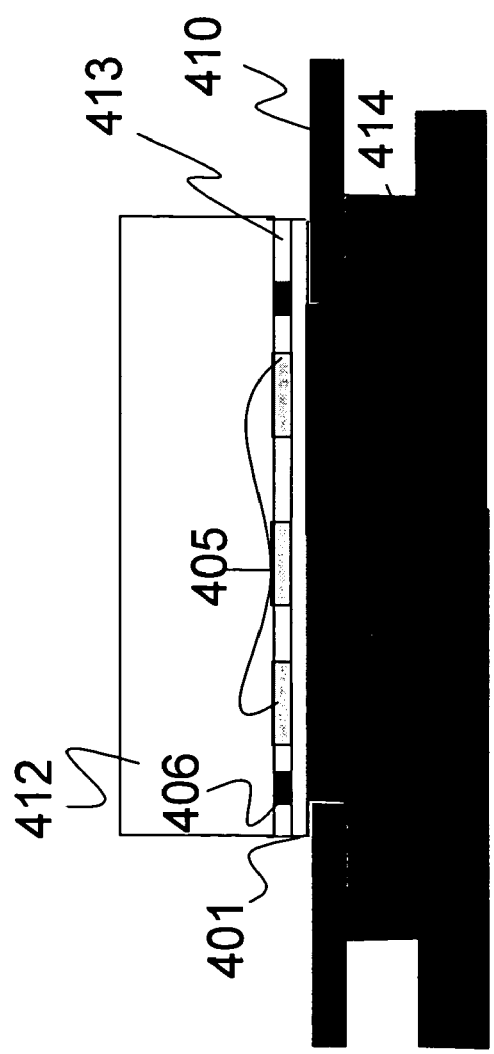

Next, as shown in FIG. 4d, an act of supporting the epilayer 401 is performed. A portion of the epilayer 401 is supported by metal frame 410 which is supported by a matching support structure 414.

Figure 4E:
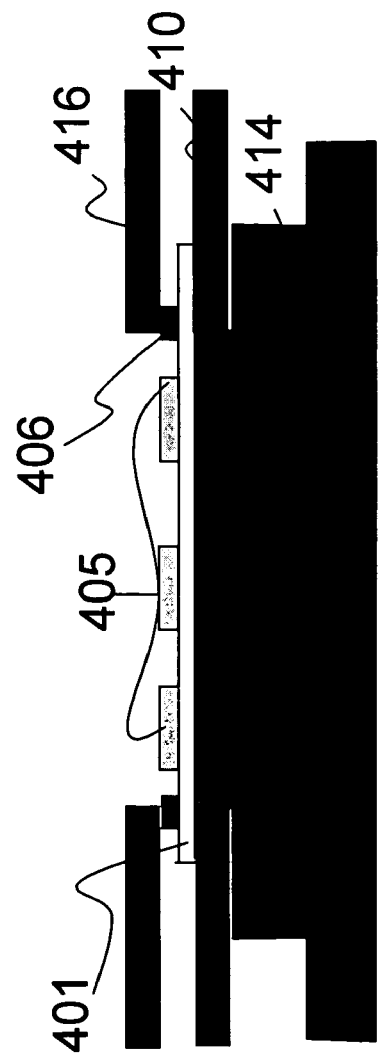

Next, the device is heated to melt the bond 413. A second metal frame 416 is used to push the support substrate 412 off of the epilayer 401, bondpads 406, and detector circuitry 405. FIG. 4e depicts the device after the support substrate 412 has been removed and replaced by the second metal frame 416.

Next, as shown in FIG. 4f metal edge clamps 222 are positioned to clamp the metal frame 410 with the second metal frame 416.

Next, the device is placed in a solvent to remove all of the wax and release the metal frame 410 and epilayer 401 from the support structure 414.

Further Etching Details

One skilled in the art will appreciate that the following etching details are described with reference to the frame-thinning embodiment. However, these etching details may also be applied with slight modifications to the full-frame thinning embodiment. In one embodiment, the etchant selected for bulk material removal is hot KOH. Hot KOH has the benefit of retaining the mirror-smooth finish of the mechanical polish while removing silicon. A quartz refluxer is used to maintain a constant concentration of the KOH (55% by weight) during the etching process. The solution is stirred continuously at approximately 80 degrees Celsius. The etch rate is 0.5 to 1.0 micrometers/minute depending on the exact solution temperature and other process conditions.

Figure 5:
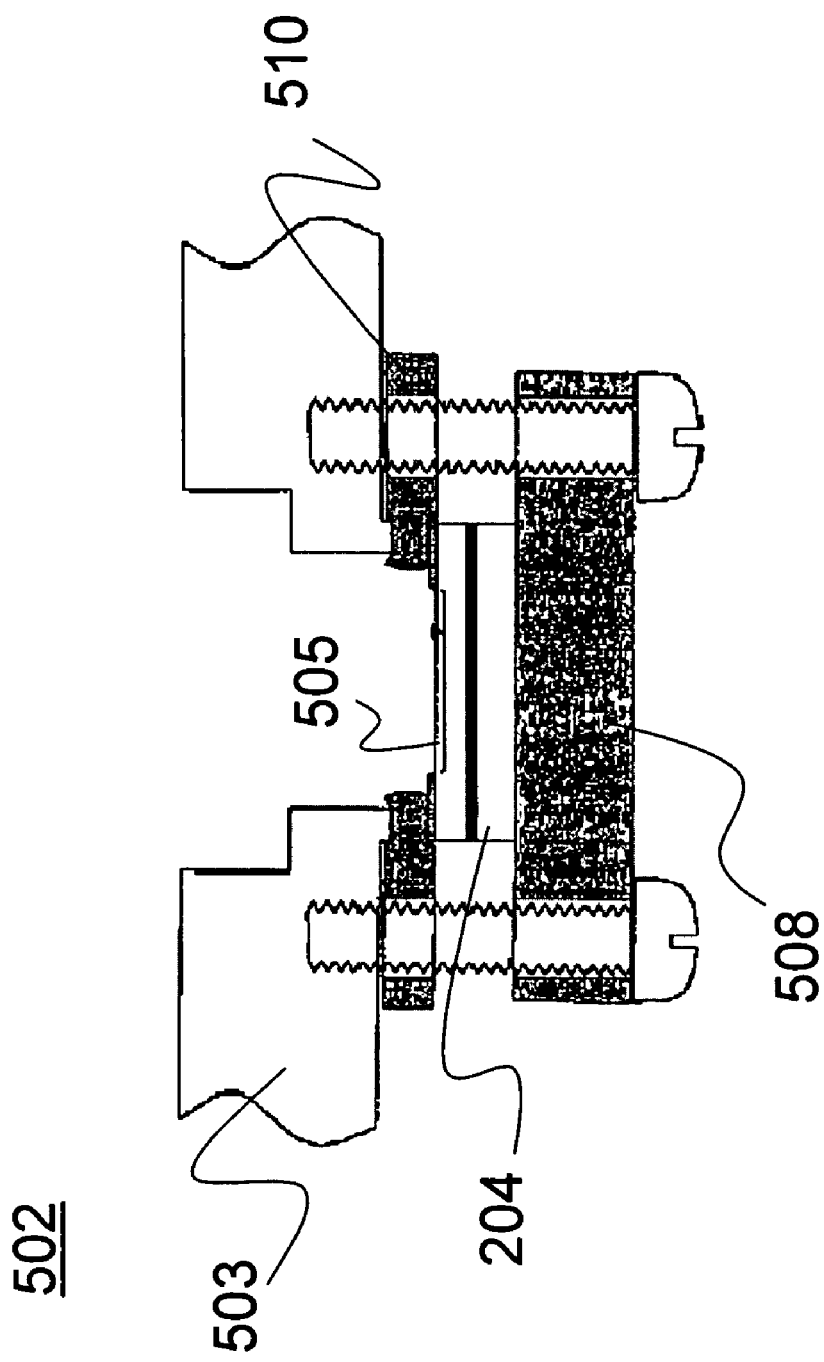
FIG. 5 depicts a fixture 502 for holding the standard device.

FIG. 5 depicts a fixture 502 for holding the standard device 204 with an opening to expose the polished side of the standard device 204. The fixture 502 is placed in the KOH bath so that the opening is facing up. The rest of the fixture and a snorkel are not shown. The fixture 502 is a four-piece design incorporating a base plate 503, a top cap (not shown), a compression plate 508, and a snorkel. Custom gaskets 510 are used to seal the die in the fixture and protect the CCD frontside circuitry. One example of a gasket material that may be used is DuPont Kalrez® perflouroelastomer (Willington, Del.), which is able to withstand strong acids and bases. The quartz compression plate 508 presses the standard device against the gasket. The snorkel, added to the top plate, allows the air inside the fixture to expand and escape. One skilled in the art will appreciate that the KOH bath comes into contact only with a portion 505 of the standard device 204 to be thinned.

The same design, with minor modifications, accommodates either an individual die or a full wafer for thinning.

At several points during the KOH etch process, the fixture 502 is removed, rinsed, and dried in order to measure the etch depth. The exposure times are calculated to bring the depth of the etched well to within 20 micrometers of the device epilayer. FIG. 2d depicts the standard device 204 after the KOH etch process.

Removal of the last 20 micrometers of the silicon 202 leading to the epilayer 201 is accomplished with solutions of hydroflouric acid, nitric acid, and acetic aid (HNA). As shown in FIG. 2e, before the solution of HNA is applied, a wax mask 215 is applied to protect the nitride layer 208 and the substrate 202. A solution with relative HNA concentrations of 1:3:8 is used, which is strongly selective depending on the resistivity of silicon. The etch rate of this solution in the p+ bulk silicon is approximately 1.5 micrometers/minute and drops by nearly two orders off magnitude in the p− epilayer. The result is that the HNA can carefully remove the remaining p+ layer. This process is closely monitored for arrival at the epilayer which is indicated by change in the color, pattern, and intensity of the activity at the solid/liquid interface. A brief sixty second exposure to a second HNA solution, with relative concentrations of 1:40:15, is used to remove a characteristic dark haze caused by the first etch. FIG. 2e depicts the standard device 204 ready for immersion in the HNA. FIG. 2f depicts the standard device 204 after the HNA treatment.

The final etch step is a quick exposure to a solution of potassium permanganate ($KMnO_4$) in hydorflouric acid. Before the last etch step, the wax mask 215 is removed. This is a ninty second exposure that removes a characteristic faint white haze left by the HNA etching. This last etch step also removes the nitride layer 208 as well.

3. Passivating Back-Illuminated Devices

In one embodiment, one surface of a curved focal plane detector array is passivated to enable the detection of UV photons and improve the detection of visible photons. Therefore, the thinned standard detector 204 may be passivated in order to improve its sensitivity and UV performance. One skilled in the art will appreciate that there are many different ways known in the art to passivate a device. In one embodiment, the passivation technique used is delta-doping.

One design concern is supporting the curved focal plane detector array while it is being passivated. The support of the curved focal plane detector array should be compatible with the processing temperatures (450 degrees C.) and ultra-high vacuum requirements of passivation, such as delta-doping.

Before passivation, an act of removing the support substrate 212 (shown in FIG. 2f) and bonding material 210 is performed, In one embodiment, where a wax bond is used, the substrate 212 is removed by melting the wax and then dissolving the wax in an organic solvent such as trichloroethylene (TCE) or xylene. FIG. 2g depicts the resulting thinned membrane 220 which can be used in forming the curved focal plane detector array 100, shown in FIG. 1.

A thinned, standard detector 204 is probe-tested at die level for functionality. Functional standard detectors 204 are carefully cleaned by a multi-step solvent soaking and rinsing process. In one embodiment, the thinned, standard detectors 204 are individually soaked in beakers of hot xylene, Nophenol 922® and isopropyl alcohol. Nophenol 922® is a universal photoresist stripper produced by EKC Technology, Inc. (Danville, Calif.). Then, the standard detector 204 is rinsed with Transene 100® while mounted on a wafer spinner at 300 revolutions per minute (rpm). Transene 100® is an isopropyl alcohol with an added surfactant produced by the Transene Company, Inc. (Danvers, Mass.). Following the solvent cleaning, a UV/ozone plasma cleaning process is performed on individual standard detectors 204. Following this act, the oxide layer of the silicon surface (formed on the silicon surface as a result of the UV/ozone clean) is removed by a 5:1 solution of hydorflouric acid in ethanol in a nitrogen glove box while the standard detector 204 is spinning at 3000 rpm. Then the standard detector 204 is loaded into a special fixture and is passed directly into the ultra-high vacuum chamber of the molecular beam epitaxy (MBE) system without any exposure to air. For more information regarding the cleaning process, the reader is directed to "Growth of a Delta-doped Silicon Layer by Molecular Beam Epitaxy on a Charge-Coupled Device for Reflection-limited Ultraviolet Quantum Efficiency," M. E. Hoenk, P. J. Grunthaner, F. J. Grunthaner, M. Fattahi, H-F. Tseng, and R. W. Terhune, Applied Physics Letters, vol. 61, p. 1084 (1992), herein incorporated by reference.

After cleaning, the standard device 204 is passed into the MBE chamber to become delta-doped. In one embodiment, as shown in FIG. 2g, an epitaxial layer 219 is grown on the surface 217 of a fully-processed, thinned standard detector 204 in the MBE system under ultra-high vacuum conditions (i.e. $10^{-10}$ torr) using electron-beam evaporation of the elemental silicon and thermal evaporation of elemental boron.

Figure 6:
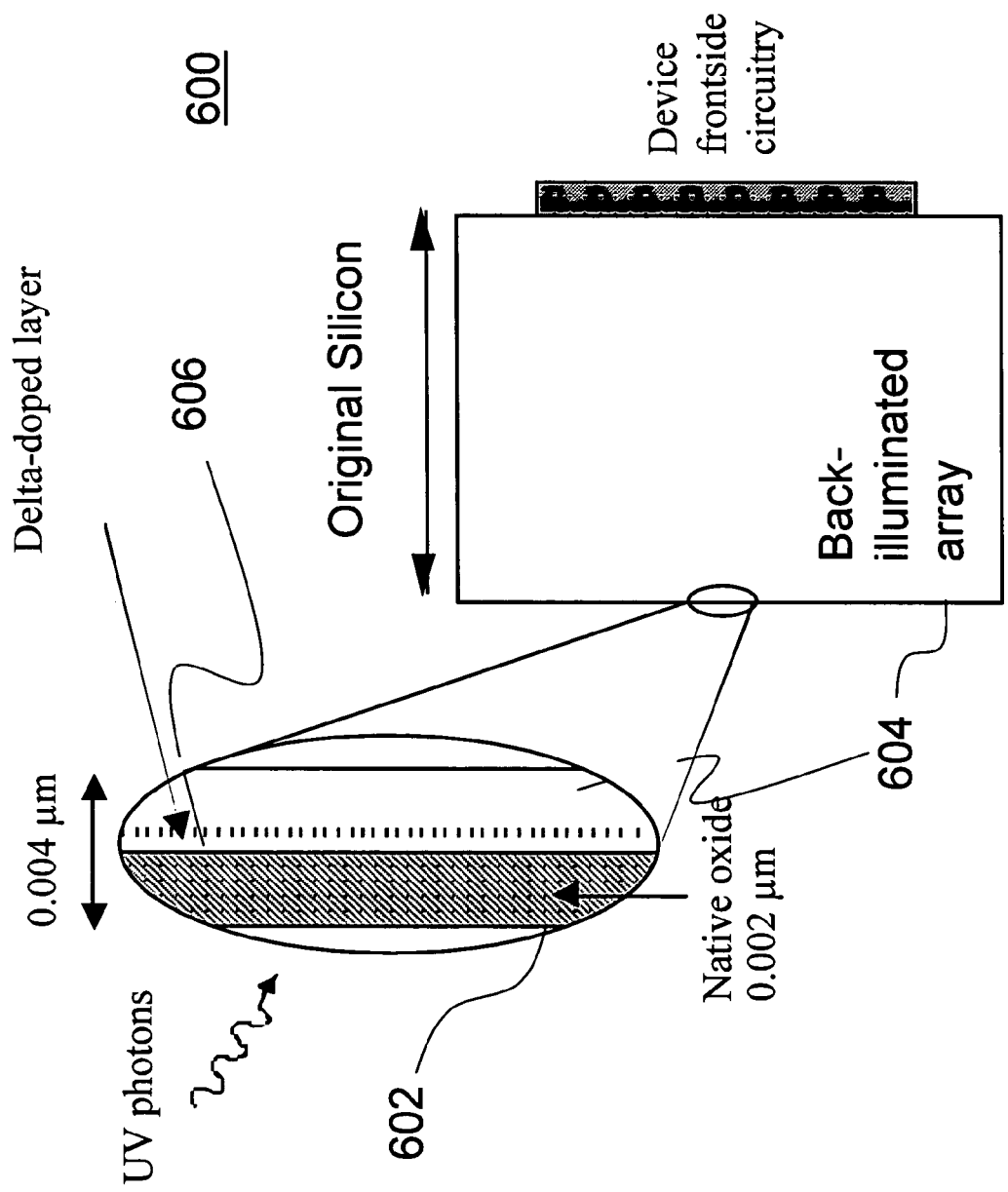
FIG. 6 depicts a delta-doping process.

As shown in FIG. 6, the process requires heating the standard detector 204 to 450 degrees Celsius for a period of a few minutes. A one nanometer p+ silicon layer 602 is grown first on one surface of the device 604, followed by an interruption of the silicon flux to deposit a sheet of $2 \times 10^{14}$ boron atoms/cm$^2$ approximately 0.5 nanometers from the surface 604 of the device. A 1.5 nanometer capping layer of epitaxial silicon is then grown. After removal from the MBE system, approximately 1 nanometer of the silicon capping layer is converted to an oxide to protect the buried delta-doped layer. Since the delta-doped layer 606 can be placed within nanometers of the silicon surface 602, it allows the creation of an extremely thin surface electrode. For more information regarding the delta-doping process, the reader is directed to "Growth of a Delta-doped Silicon Layer by Molecular Beam Epitaxy on a Charged-Coupled Device for Reflection-limited Ultraviolet Quantum Efficiency," M. E. Hoenk, P. J. Grunthaner, F. J. Grunthaner, M. Fattahi, H-F.1 Tseng, and R. W. Terhune, Applied Physics Letters, vol. 61, p. 1084 (1992), "Delta-Doped CCDs: High QE with Longterm Stability at UV and Viusible Wavelenghts," S. Nikzad, M. E. Hoenk, P. J. Grunthaner, R. W. Terhune, F. J. Grunthaner, R. Wizenread, M. Fattahi, and H-F. Tseng, Proceedings of SPIE, vol. 2198 p. 907(1994), and "Delta-doped CCDs as Stable, High Sensitivity, High Resolution UV Imaging Arrays," S. Nikzad, M. E. Hoenk, P. J. Grunthaner, R. W. Terhuyne, R. Wizenread, M. Fattahi, H-F. Tseng, and F. J. Grunthaner, Proceedings of SPIE, vol. 2217, p. 355 (1994).

4. Forming a Curved Focal Plane Detector Array from a Thin Membrane

Figure 7:
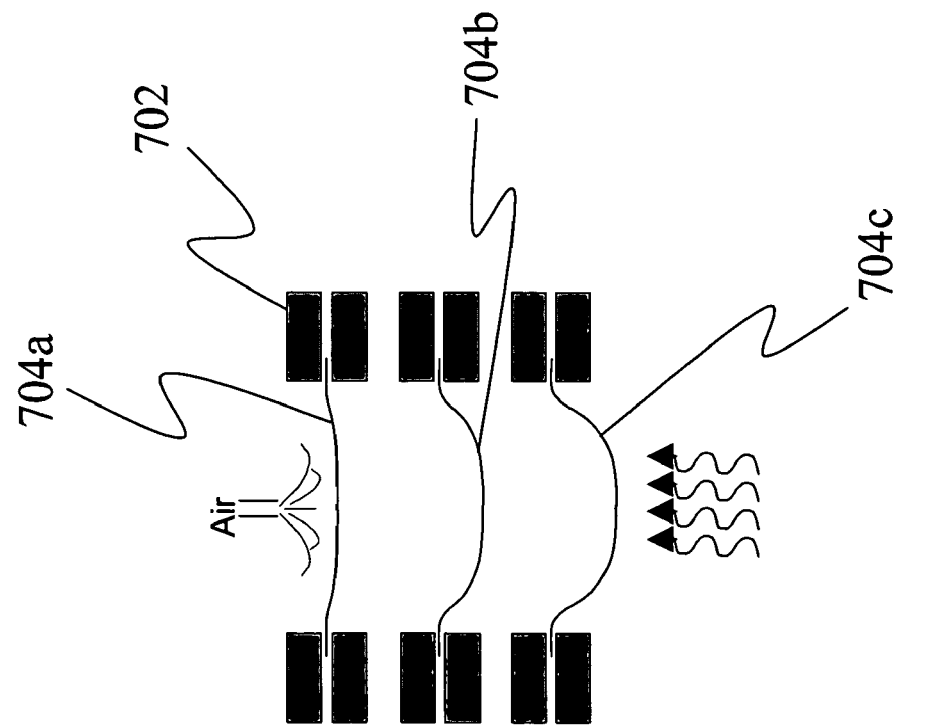
FIG. 7 depicts thinned membranes being formed into a finite radius of curvature by air pressure.

In the next act, the thinned membrane 220 is formed into a curved surface. One skilled in the art will appreciate that there are many different ways that this act could be performed. For example, FIG. 7 depicts several thinned membranes 704a, 704b, and 704c being formed into curved surfaces having various radii of curvature. These thinned membranes 704a, 704b and 704c are supported on their edges by membrane supports 702. Air pressure is utilized to create the various radii of curvature. In the embodiment depicted in FIG. 7, the membranes 704a, 704b and 704c are illuminated on the surface of the membranes opposite the air pressure.

Figure 8:
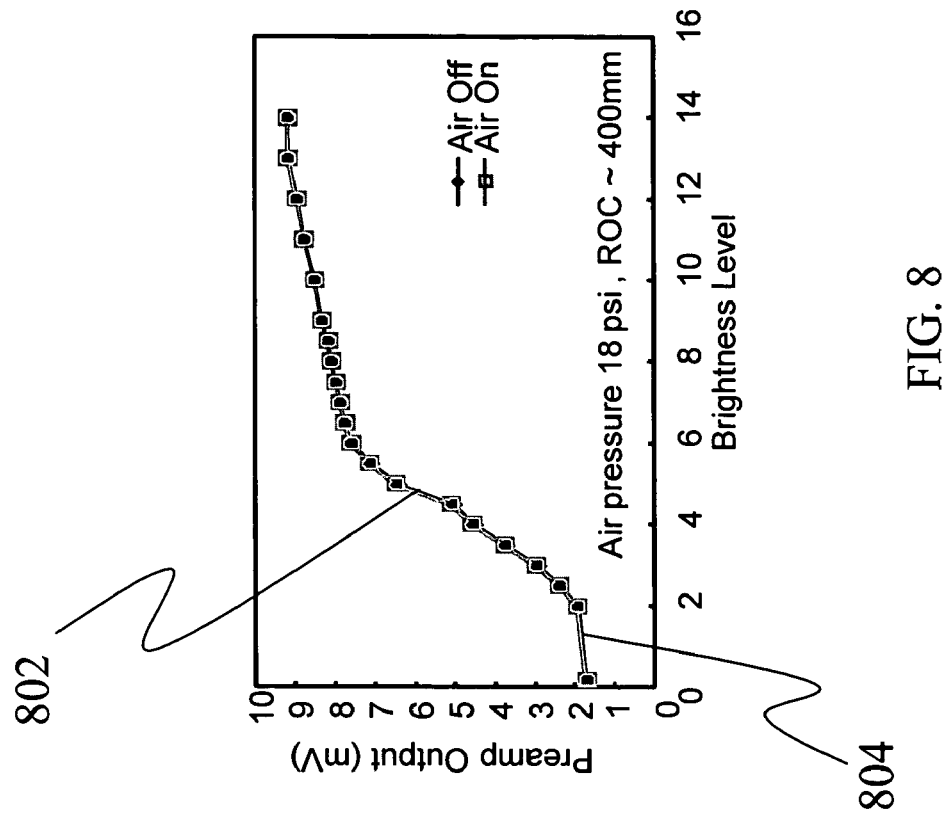
FIG. 8 illustrates that the forming of the thin membrane into a finite radius of curvature does not effect the electrical properties.

A 10-μm thick, 1,000×1,000, 12 μm pixel CCD was tested while varying the radius of curvature (ROC) from 250-500 mm by applying air pressure as shown in FIG. 7. The results are plotted in FIG. 8. The line representing Air On 802 (representing when the thin membrane is curved) is right on top of the line representing air off 804 (representing when the thinned membrane is flat). Thus, FIG. 8 shows that the light sensitivity is independent of the curvature.

Figure 9B:
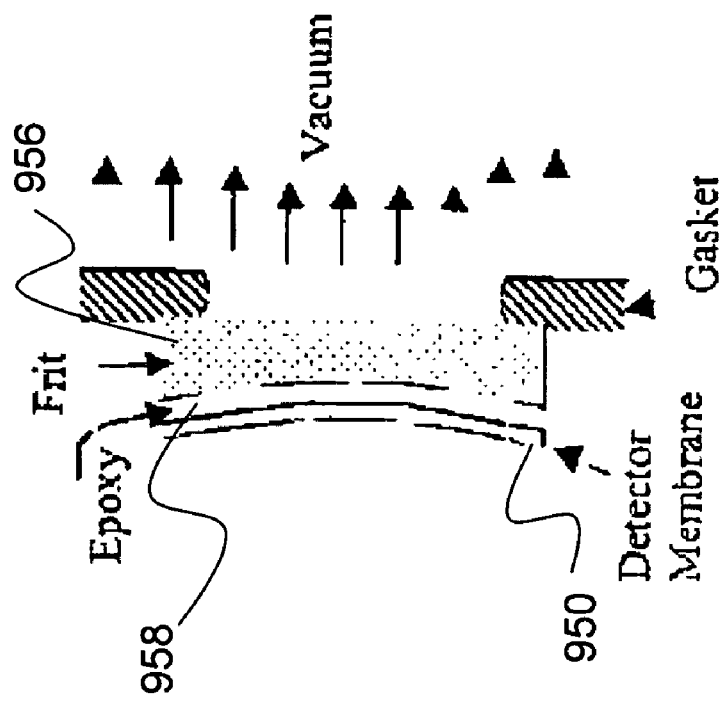
FIG. 9b illustrates the thinned membrane being applied to a curved substrate via a vacuum.
Figure 9A:
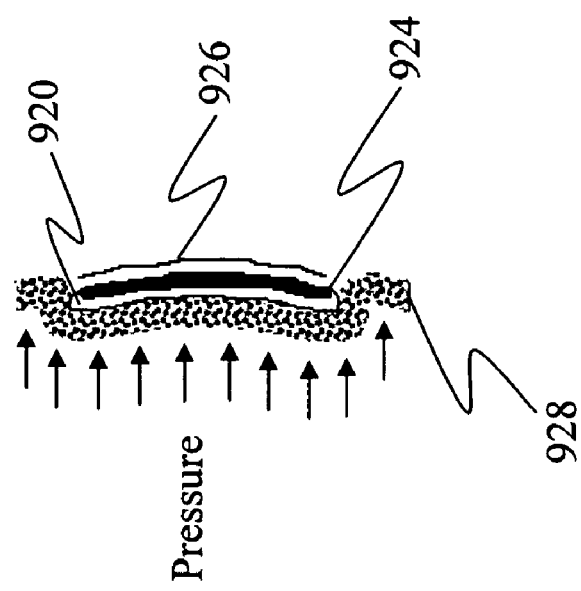
FIG. 9a illustrates the thinned membrane being applied to a curved substrate via air pressure.

In another embodiment, shown in FIG. 9a, the thinned membrane 920 is applied to a curved substrate 926. The technical hurdles to overcome when bonding a thinned membrane 920 to a curved substrate 926 are: 1) eliminating particulates that corrupt the ultimate smoothness of the surface, and 2) potential changes to the electrical properties of the thinned membrane 920 when it is strained by adapting the curvature of the curved substrate 926. Careful attention to cleaning and surface preparation may eliminate the particle problem. The effect of induced strain may be investigated by testing the same thinned membrane on a flat substrate and then again on progressively curved substrates. This will provide a limit as to how much strain may be applied before the device experiences operational problems.

In the embodiment shown in FIG. 9a, the thinned membrane 920 is gently pushed (using air pressure) onto the curved substrate 926. In this embodiment, an optional balloon membrane 928 is placed between the air pressure and the thinned membrane 920. Air pressure is applied to the balloon membrane 928 to press the thinned membrane 920 into contact with the curved substrate 926 coated with a layer of bonding material 924, such as melted wax or epoxy.

In another embodiment, as shown in FIG. 9b, the thinned membrane 950 is pulled (using vacuum) to attach with a curved substrate 956. In one embodiment, the curved substrate 956 comprises polished flitted disks. These frits are made of very fine quartz spheres fused together and polished to a very fine surface. Frits are available in various grades of porosity and can be polished to specific shape or curvature. The detector membrane 950 is pulled via air pressure into contact with the curved substrate 956 coated with a layer of bonding material 958, such as melted wax or epoxy.

One skilled in the art will appreciate that the above described process of forming the thinned membrane into a curved thinned membrane may be used to form either convex or concave shapes. Further, in the embodiment shown in FIG. 7, the membrane may be illuminated on either the frontside or the backside. Therefore, either a back-illuminated or front-illuminated thinned membrane focal plane detector array may be formed having either convex or concave radii of curvature.

Further, one skilled in the art will appreciate that the thinned membrane may be bonded to a piezoelectric transducer (PZT) wafer in the flat state. The PZT wafer can then be activated to provide a curvature which may be adjusted over a range according to the applied voltage to the PZT. Further, the thinned membrane may be bonded to a portion of a small volume that may be gently pressurized. In this case, the range of curvature may be achieved by adjusting the pressure.

Figure 10:
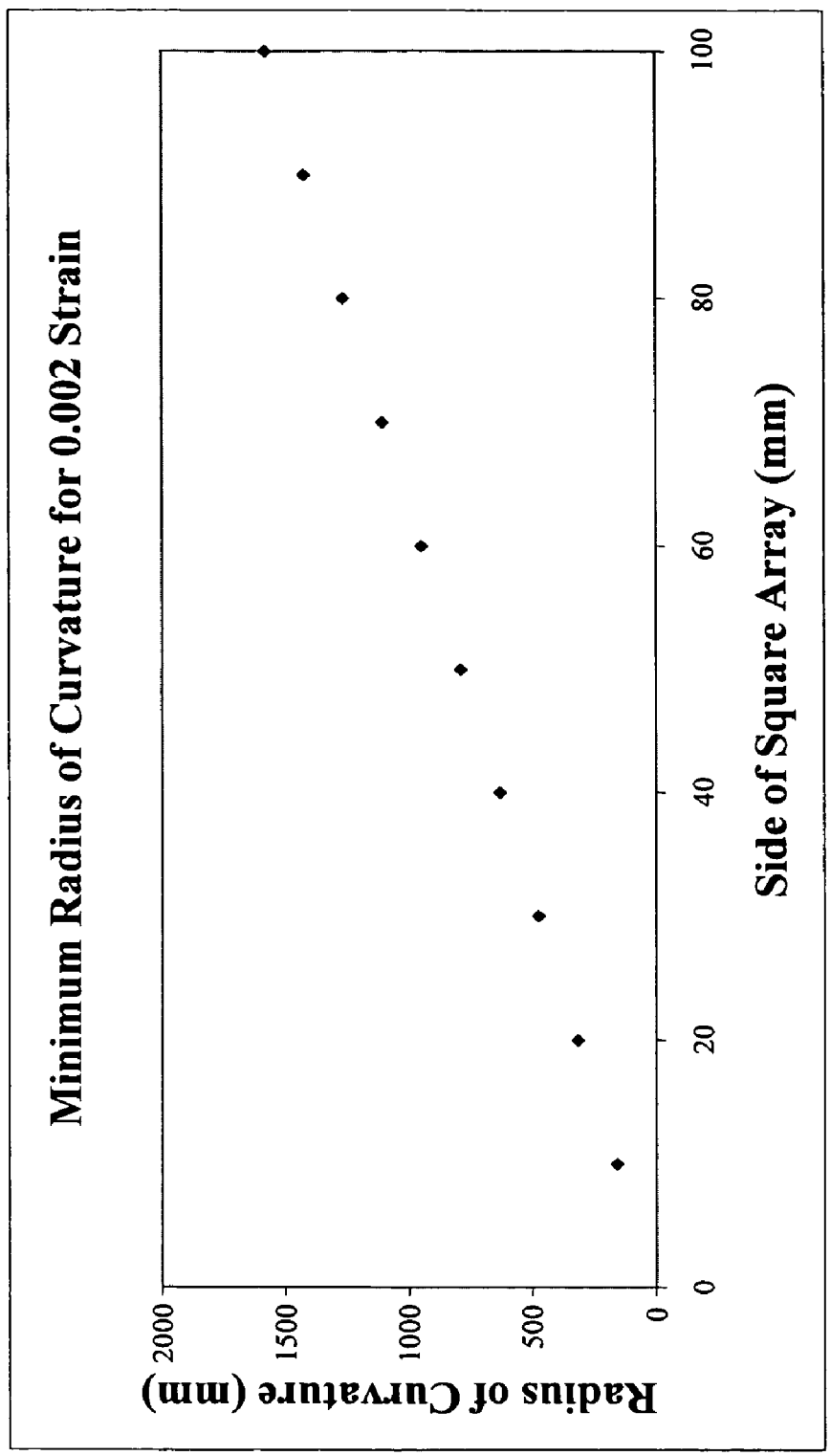
FIG. 10 shows results of calculation for mapping a square silicon membrane onto a spherical surface.

The limitation on the radius of curvature with thinned membrane depends on curvature shape (e.g., cylindrical or spherical), material (1.0% maximum strain limit for silicon), as well as the size of the array. FIG. 10 shows results of calculation for mapping a square silicon membrane (respecting a 0.2% strain condition) onto a spherical surface. It is shown in the figure that larger arrays can be curved gently (large radius of curvature (ROC)) while small arrays can accommodate more severe curvatures (small ROC). In general, this applies to spherical curvature; cylindrical shapes can be more severely curved.

In one embodiment, a 10 μm thick, 1,000 K×1,000 K, 12 μm pixel CCD is curved to an ROC~200 mm and permanently attached with a curved substrate with an ROC of 200 mm.

The techniques proposed above are not only applicable to silicon detector arrays but can be extended to curved focal plane arrays made from various material systems. For example, gallium nitride and its alloys are of particular interest because they are wide bandgap (3.4 eV to 6.2 eV), with intrinsic far UV response and strong visible rejection ratio ($>10^5$). The type III-nitrides possess direct bandgap, and tailored energy cutoff (varying alloy fractions). The III-nitrides are robust, radiation tolerant, and can operate at higher temperatures than silicon photodetector arrays. Further, they are piezoelectric. An approach for fabricating thinned membranes of nitrides has been developed, for which the reader is directed to the paper entitled "Fabrication of GaN suspended Microstructures," R. P. Strittmatter, R. A. Beach, T. C. McGill, Applied Physics Letters, 78, 3226 (2001).

C. Overview of the Curved High-Purity Detector Array

FIG. 11 depicts another embodiment of a curved focal plane array (CFPA), using a high-purity detector array 1100. The high-purity detector array 1100 comprises of a thick layer of highly-pure substrate 1104 such as silicon, where the back surface 1102 of the detector array 1100 is curved and polished to achieve a desired curvature for a representative optical system that provides focused photons. Highly-doped electrodes 1106 are added to one side of the substrate 1102 by diffusion, implantation, or deposition. In one embodiment, the electrode is added to the back surface 1102 using delta-doping to provide for a high, stable, quantum efficiency (QE) for back-illuminated silicon detectors.

D. Process for Making the Curved High-Purity Detector Array

A curved high-purity detector array comprises a high-purity detector array in which one side has been polished to form a curved surface. The Lawrence Berkeley National Lab (LBNL) (Berkeley, Calif.) is one source of two-dimensional high-purity devices, typically with thicknesses of 400-600 micrometers. To achieve a desired radius of curvature, the back surface 1102 of the substrate layer is polished into a spherical or cylindrical surface. The method of polishing the back surface 1102 of the substrate layer 1104 is similar to that used to form telescopic lenses.

Next, a thin conductive electrode 1106 is incorporated into the back surface 1102 using previously-developed and described delta-doping technology. Finally, the detector array 1100 is electrically tested for its depletion properties, after which it will be ready for optical testing. One skilled in the art will appreciate that the details regarding the delta-doping process are for p- doped substrates. Modification, for example, in the type of dopant used is required when the substrate is n-doped.

Unlike the curved thinned membrane discussed above, high purity devices do not require removal of the substrate for operation. As the substrate layer can be thick, the layer will not wrinkle under stress, and the thickness of the substrate also provides a longer lifespan than with the curved thinned membrane.

Figure 12:
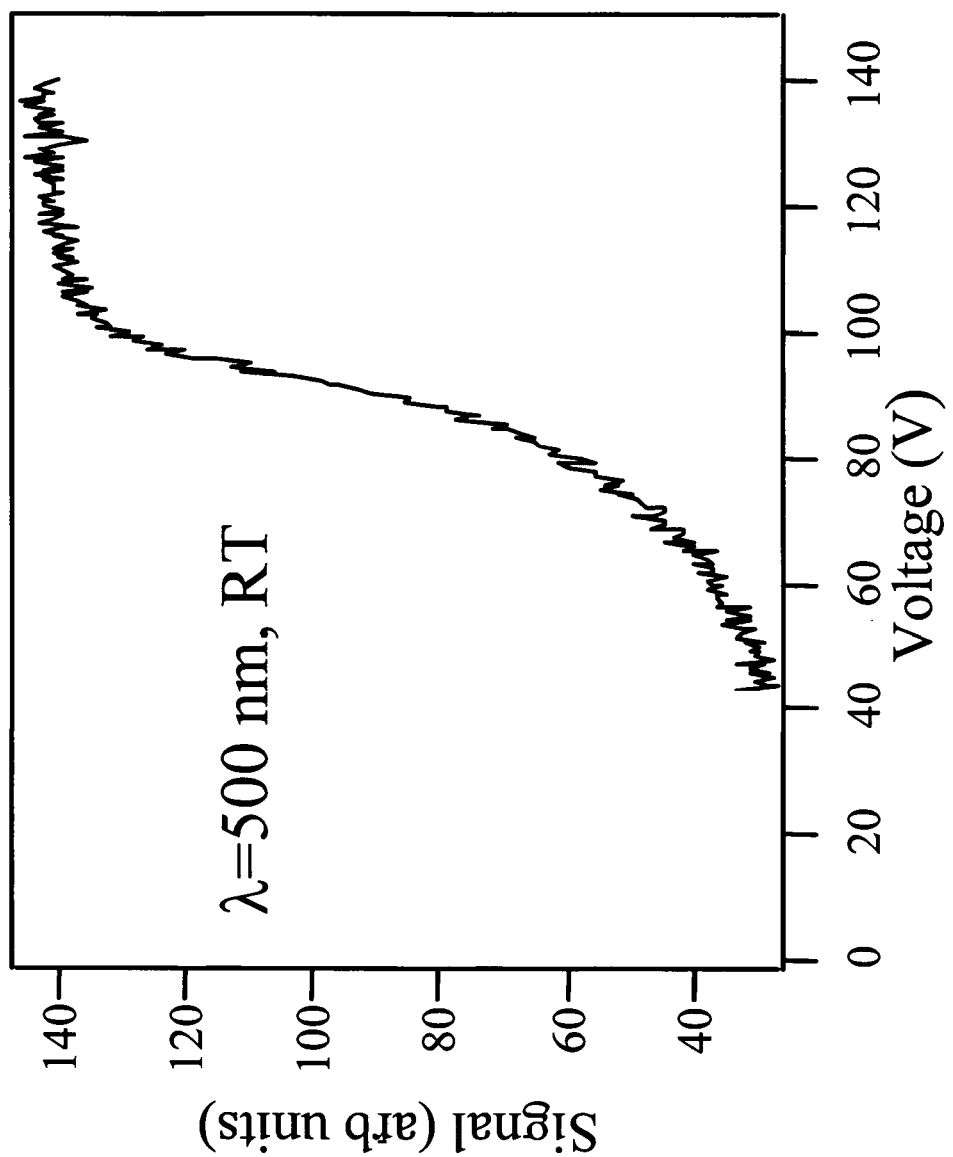
FIG. 12 illustrates how a curved detector array can be depleted without any breakdown at the thinnest point of the detector.

A further advantage of the high-purity detector array is the ability of the surface to be polished into a deep curvature; in some cases removing more than half of the substrate layer from the backside at the center of the detector array. This ability allows separation of the CFPA fabrication process from the very-large scale integration (VLSI) fabrication process, avoiding the difficult and expensive challenges of adapting VLSI processing to curved substrates. FIG. 12 further illustrates how a curved detector array can be depleted without any breakdown at the thinnest point of the detector.

High-purity detector arrays can be fully depleted across the entire thickness of the device using low voltages. In fully-depleted devices, carriers generated throughout the device, even near the back surface, are driven to the front surface for collection under the influence of an electric field. The result of this full depletion is excellent point spread function of the device and elimination of lateral diffusion which would otherwise degrade the image quality.

Figure 13:
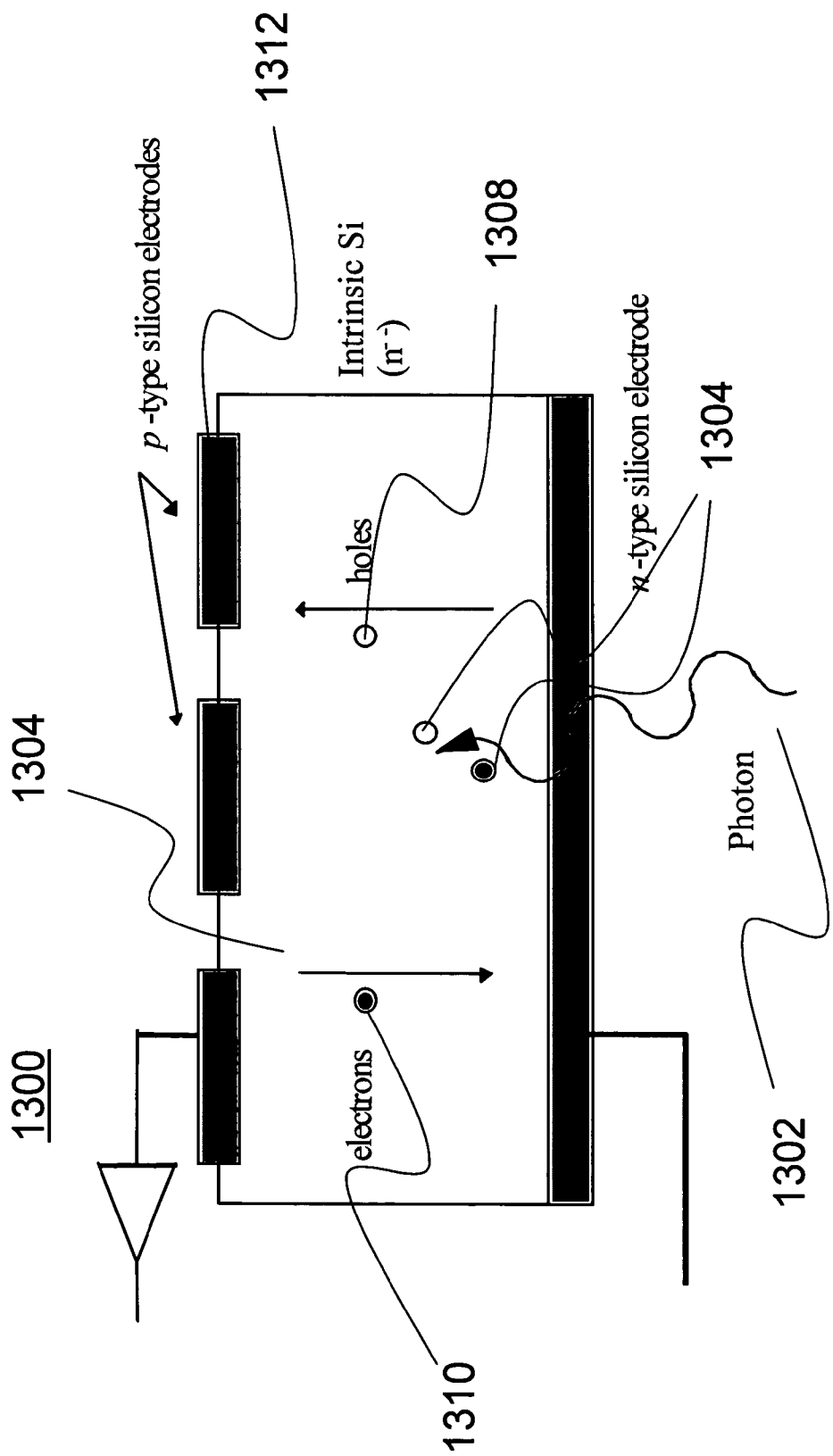
FIG. 13 depicts how a photon is absorbed in the substrate, whereby it generates an electron-hole pair at the point of absorption.

FIG. 13 depicts how a photon 1302 is absorbed in the substrate 1304, whereby it generates an electron-hole pair 1306 at the point of absorption. Minority carriers 1308, represented as holes in n-type substrates, that are generated by the photon 1302, are separated from majority carriers 1310 (electrons) and are swept to the front side circuitry 1312 by modest potentials of approximately 20-100 volts. Electron-hole pairs 1306 are separated by the electric field in the depletion region and charge is collected by the front side circuitry 1312, providing a measure of the intensity of illumination.

The thickness of the surface electrodes still determines the cut-off wavelength of the detector. This is because the electrodes are relatively heavily doped and remain undepleted. There is no electric field to separate electron-hole pairs generated in the electrodes and, with overwhelming probability, the electrons and holes simply recombine without being measured. This is known as a dead layer, and is especially apparent in the blue and ultraviolet regions. Delta-doping effectively removes the dead layer and results in a highly stable, 100 percent internal QE for the detector in the visible, UV, far UV, and extreme UV. Furthermore, the delta-doped layer will also act as the surface electrode for depletion of the thick detectors.

Figure 14:
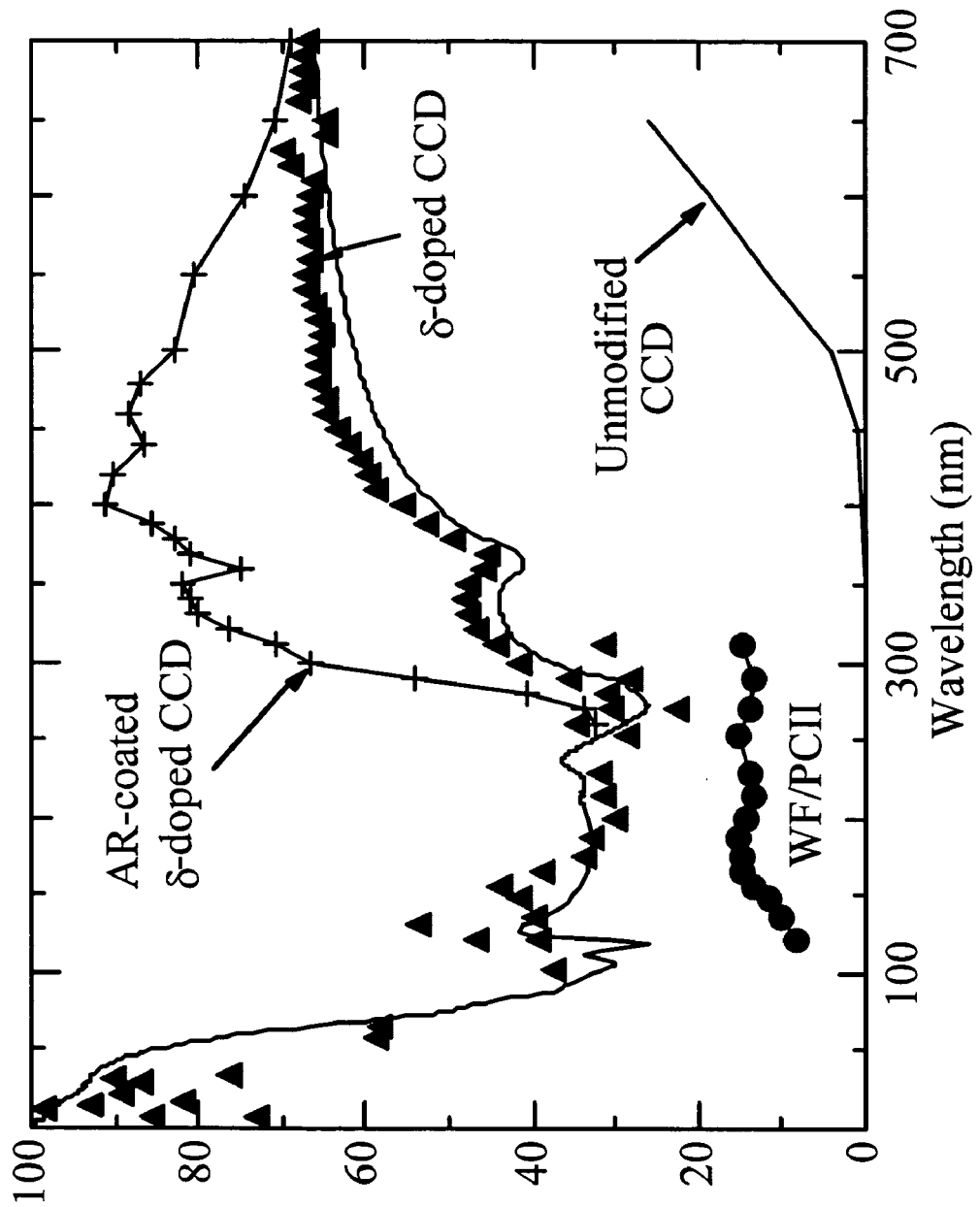
FIG. 14 illustrates how delta-doped CCDs exhibit 100 percent internal QE from extreme UV to the visible.

Back-illuminated devices with appropriate back surface treatment provide the highest quantum efficiency in silicon detector arrays. Delta-doping is a technique developed to modify the bandstructure of back-illuminated silicon CCDs. The use of delta-doping increases the internal QE to 100 percent in the entire range from extreme UV, visible, to near IR. "Delta-doping" refers to a strongly-peaked doping profile of high magnitude and thin width, resembling the mathematical "delta function." FIG. 14 illustrates how delta-doped CCDs exhibit 100 percent internal QE from extreme UV to the visible.

What is claimed is:

1. A method for manufacturing a detector array comprising acts of: removing a portion of bulk material from a solid-state focal plane detector array to form a deformable membrane having a detector circuitry side and a second side; passivating the second side of the deformable membrane; and conforming the deformable membrane, such that a portion of the deformable membrane has a finite radius of curvature, wherein the act of passivating comprises an act of delta-doping the second side of the deformable membrane;

wherein the act of conforming includes acts of: coating a curved substrate with a bonding material; and pushing the deformable membrane onto the curved substrate; and further including an act of forming the curved substrate from polished fritted disks.

* * * * *